(12) United States Patent
Yoo et al.

(10) Patent No.: US 8,916,439 B2
(45) Date of Patent: Dec. 23, 2014

(54) METHOD FOR FORMING DUAL GATE INSULATION LAYERS AND SEMICONDUCTOR DEVICE HAVING DUAL GATE INSULATION LAYERS

(75) Inventors: Ji-Hyoung Yoo, Cupertino, CA (US); Ze-Qiang Yao, Santa Clara, CA (US); Jeesung Jung, San Jose, CA (US); Haifeng Yang, Shanghai (CN)

(73) Assignee: Monolithic Power Systems, Inc., San Jose, CA (US)

( * ) Notice: Subject to any disclaimer, the term of this patent is extended or adjusted under 35 U.S.C. 154(b) by 362 days.

(21) Appl. No.: 13/554,665

(22) Filed: Jul. 20, 2012

(65) Prior Publication Data
US 2014/0024186 A1    Jan. 23, 2014

(51) Int. Cl.
*H01L 21/8234*    (2006.01)

(52) U.S. Cl.
USPC ............................ 438/275; 257/335; 257/500

(58) Field of Classification Search
USPC .................................. 257/335, 500; 438/275
See application file for complete search history.

(56) References Cited

U.S. PATENT DOCUMENTS 6,709,931 B2 * 3/2004 Kim ............................. 438/275

* cited by examiner

*Primary Examiner* — David Vu
(74) *Attorney, Agent, or Firm* — Perkins Coie LLP

(57) ABSTRACT

Method of forming dual gate insulation layers and semiconductor device having dual gate insulation layers is disclosed. The method of forming dual gate insulation layers comprises forming a first thin layer of a thick gate insulation layer on a semiconductor substrate by oxidizing the semiconductor substrate, depositing a second thicker layer of the thick gate insulation layer on the first thin layer, removing a portion of the thick gate insulation layer to expose a surface area of the semiconductor substrate and forming a thin gate insulation layer on the exposed surface area of the semiconductor substrate. The method of forming dual gate insulation layers, when applied in fabricating semiconductor devices having dual gate insulation layers and trench isolation structures, may help to reduce a silicon stress near edges of the trench isolation structures and reduce/alleviate/prevent the formation of a leaky junction around the edges of the trench isolation structures.

20 Claims, 9 Drawing Sheets

METHOD FOR FORMING DUAL GATE INSULATION LAYERS AND SEMICONDUCTOR DEVICE HAVING DUAL GATE INSULATION LAYERS

TECHNICAL FIELD

This disclosure relates generally to field of manufacturing semiconductor devices, and particularly but not exclusively relates to method of forming semiconductor devices having dual gate insulation layers.

BACKGROUND

With the advances in semiconductor technology, integrated circuits (IC) having multi-functional circuit modules composed of a large number of transistors and/or other semiconductor devices integrated on a silicon die are more and more popular. For example, in integrated circuits of VLSI and ULSI, the number of transistors and/or other semiconductor devices included is huge and the devices are densely packed together. Therefore, it is important to have isolation structures between adjacent transistors/devices to prevent short circuit occurring between neighboring transistors/devices. The most commonly used isolation structures may include field oxide isolation, and trench isolation such as shallow trench isolation ("STI"). However, as line width of semiconductor device falls to below 0.25 μm, isolating devices using a field oxide layer become infeasible and trench isolation becomes the only means of device isolation.

Furthermore, in an integrated circuit, different circuit modules and/or transistors and other devices in the same chip may operate in different voltage regimes. For example, in an integrated switching-mode power supply, which may generally comprise a power transistor and a control circuit for switching the power transistor ON and OFF to convert a supply voltage into a desired output voltage, the power transistor may have an operating voltage much higher than an operating voltage of transistors constituting the control circuit. In order to have area-efficient high voltage device with low voltage control devices fabricated on a same die in a technology, dual gate insulation layers are desired. For example, a first gate insulation layer of a first thickness (e.g. 100 Å) is desired for forming both high voltage devices and low voltage devices, e.g. functioning as a gate insulation layer for gates of high voltage devices and low voltage devices; a second gate insulation layer of a second thickness (e.g. 500 Å), which is relatively thicker than the first thickness, is desired for forming high voltage devices, e.g. functioning as a gate insulation layer of a field plate atop a drift region (in most cases, the field plate may comprise a portion of the gate extended on top of the drift region) of high voltage devices. Therefore, dual gate insulation layers are necessary to form devices having different voltage ratings on a die. A relatively thin gate insulation layer supports the formation of both high voltage rated devices and low voltage rated fast devices while a relatively thick gate insulation layer supports the formation of high voltage rated devices.

From the above, it can be understood that manufacturing semiconductor devices having dual gate insulation layers with trench isolation tends to be necessary for fabricating an integrated circuit based on a reduction of fabrication line width. Nevertheless, several drawbacks may become noticeable when forming dual gate insulation layers of a semiconductor device having trench isolation (e.g. Shallow trench Isolation a.k.a. STI) structures with conventional manufacturing processes. For example, FIGS. 1A through 1C are cross-sectional views for illustrating a conventional process for fabricating semiconductor devices having dual gate insulation layers and STI structures. In the conventional manufacturing process, a thick gate oxide layer 12 is usually formed with thermal oxidation after the formation of a STI structure 11 in a substrate 10, as illustrated in FIG. 1A. The STI structure 11 may define a first active region HV of high-voltage regime and a second active region LV of low-voltage regime, and may also be used for isolating devices that will be formed on each of the first and second active regions. The thick gate oxide layer 12 is provided for forming semiconductor devices operating at the high-voltage regime, for example. Since the thick gate oxide layer 12 is typically formed by thermal oxidation, growing of the thick gate oxide layer 12 may consume a relatively large portion of the underlying semiconductor substrate 10, and thus the thick gate oxide layer 12 may have a substantial portion infringed down into the substrate 10, as illustrated in FIG. 1A. If a thickness of the thick gate oxide layer 12 exceeds 150 Å, it may cause silicon stress near the edges of the STI structures 11 due to incommensurate growth of the thick gate oxide layer 12, leading to silicon defects, which may be a leakage source. In addition, due to an oxidation rate difference over the semiconductor substrate 10 (such as silicon substrate) and the STI structures 11 (such as oxide STI structures), the thick gate oxide layer 12 formed by thermal oxidation over the STI regions 11 would be much thinner than that formed on the semiconductor substrate 10, which may be a main source of pits that would appear near the edges of the STI structures 11 in the following manufacturing steps. In a subsequent step, as illustrated in FIG. 1B, the thick gate oxide layer 12 over a portion of the substrate whereon a thin gate oxide layer should be formed is removed and the portion of the substrate 10 is exposed. During the removing process of the thick gate oxide layer 12 and subsequent cleaning processes, edges of the STI structures 11 may be over etched and pits 13 may appear, which may result in a leaky $N^+$/P-well or $P^+$/N-well junction near the edges of the STI structures 11 during subsequent active region (such as source/drain region) formation processes. In the following, as illustrated in FIG. 1C, a thin gate oxide layer 14 is formed by thermal oxidation over the exposed portion of the substrate 10, and then gates 15, source/drain regions 16 etc. are formed. The semiconductor devices formed on the first active region HV illustrated in FIG. 1C may comprise lateral DMOS (double diffused metal-oxide semiconductor) transistors, and the semiconductor devices formed on the second active region illustrated in FIG. 1C may comprise low-voltage MOS (metal-oxide semiconductor) transistors. According to the conventional fabrication method, a leaky $N^+$/P-well or $P^+$/N-well junction may appear near the edges of the STI structures 11 due to existence of pits 13.

According to the conventional manufacturing process, junction leakage and threshold variation problems may be aggravated as the silicon stress and size of the pits 13 near the edges of the STI structures 11 increase, especially with the reduction of line width of semiconductor devices for reducing die size and achieving high integration. Therefore, it is tough to incorporate a dual gate insulation structure and a trench isolation structure (such as STI structure) with the conventional fabrication process. The device yield may be quite low.

SUMMARY

In accordance with an embodiment of the present disclosure, a method for forming dual gate insulation layers, comprising: providing a semiconductor substrate; forming a first thin layer of a first gate insulation layer on the semiconductor substrate by oxidizing the underlying semiconductor substrate; depositing a second thicker layer of the first gate insulation layer on the first thin layer, wherein the first gate insulation layer has a first thickness; removing a portion of the first gate insulation layer, thereby exposing a surface area of the semiconductor substrate; and forming a second gate insulation layer on the exposed surface area of the semiconductor substrate, wherein the second gate insulation layer has a second thickness thinner than the first thickness.

In addition, there has been provided, in accordance with an embodiment of the present disclosure, a method of forming a semiconductor device having dual gate insulation layers, comprising: providing a semiconductor substrate having a first active region of a first voltage regime and a second active region of a second voltage regime different from the first voltage regime; forming a first thin layer of a first gate insulation layer on the semiconductor substrate by oxidizing the underlying semiconductor substrate; depositing a second thicker layer of the first gate insulation layer on the first thin layer, wherein the first gate insulation layer has a first thickness; removing a portion of the first gate insulation layer, thereby leaving a remained portion of the first gate insulation layer and exposing a surface area of the semiconductor substrate; forming a second gate insulation layer on the exposed surface area of the semiconductor substrate, wherein the second gate insulation layer has a second thickness thinner than the first thickness; forming a first gate on top of the first active region and a second gate on top of the second active region, wherein the first gate overlies at least a portion of the remained portion of the first gate insulation layer, and wherein the second gate overlies at least a portion of the second gate insulation layer, and wherein the first gate is used for a first semiconductor device operating at the first voltage regime, and wherein the second gate is used for a second semiconductor device operating at the second voltage regime; and forming source and drain active regions in the semiconductor substrate for the first semiconductor device and the second semiconductor device.

Further, there has been provided, in accordance with an embodiment of the present disclosure, a method of forming a lateral DMOS, comprising: providing a semiconductor substrate; forming a first thin layer of a thick gate insulation layer on the semiconductor substrate by oxidizing the underlying semiconductor substrate; depositing a second thicker layer of the thick gate insulation layer on the first layer; removing a portion of the thick gate insulation layer, thereby leaving a remained portion of the thick gate insulation layer and exposing a surface area of the semiconductor substrate, wherein the remained portion of the thick gate insulation layer constitutes a thick gate dielectric of the lateral DMOS; forming a thin gate insulation layer on the exposed surface area of the semiconductor substrate; forming a gate of the lateral DMOS, wherein the gate comprises a first portion overlying a portion of the thin gate insulation layer and a second portion overlying a portion of the thick gate dielectric; and forming source and drain active regions in the semiconductor substrate for the lateral DMOS.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features. Likewise, the relative sizes of elements illustrated by the drawings may differ from the relative size depicted.

FIGS. 2A through 2J are cross-sectional views illustrating schematically a sequential process of a method for forming dual gate insulation layers in accordance with an embodiment of the present invention, wherein FIGS. 2A through 2D are cross-sectional views illustrating a method for forming a shallow trench isolation layer in accordance with an embodiment of the present invention, and wherein FIGS. 2E through 2J are cross-sectional views illustrating a method for forming dual gate insulation layers in accordance with an embodiment of the present invention.

Figure 1A:
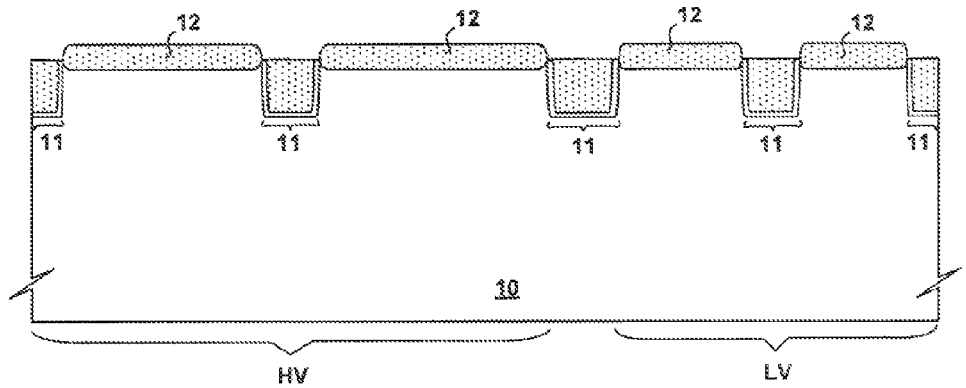
FIGS. 1A through 1C are cross-sectional views illustrating schematically a sequential process of a conventional method for forming a semiconductor device having dual gate insulation layers.

The use of the same reference label in different drawings indicates the same or like components or structures with substantially the same functions for the sake of simplicity.

DETAILED DESCRIPTION

Various embodiments of the present invention will now be described. In the following description, some specific details, such as example device structures, example manufacturing process and manufacturing steps, and example values for the process, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the terms "left," "right," "in," "out," "front," "back," "up," "down, "top," "atop", "bottom," "over," "under," "overlying," "underlying," "above," "below" and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner to establish an electrical relationship between the elements that are coupled. The terms "a," "an," and "the" includes plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. Those skilled in the art should understand that the meanings of the terms identified above do not necessarily limit the terms, but merely provide illustrative examples for the terms.

FIGS. 2A through 2J are cross-sectional views illustrating schematically a sequential process of a method for forming dual gate insulation layers of a semiconductor device in accordance with an exemplary embodiment of the present invention. Referring to FIGS. 2A-2D, a first isolation layer 21 and a second isolation layer 22 are formed in a semiconductor substrate 20. The semiconductor substrate 20 may comprise a first active region HV of a first voltage regime (e.g. a high/medium-voltage regime) and a second active region LV of a second voltage regime (e.g. a low-voltage regime) lower than the first voltage regime. In one embodiment, the first active region HV is designated for forming semiconductor devices operating at the first voltage regime, and the second active region LV is designated for forming semiconductor devices operating at the second voltage regime.

In one embodiment, the first isolation layer 21 is formed for defining the first active region HV and the second active region LV, and the second isolation layer 22 is formed for isolating the semiconductor devices formed on each of the first and second active regions. In one embodiment, the first isolation layer 21 may comprise a trench isolation layer, and the second isolation layer 22 may also comprise a trench isolation layer. In one embodiment, the first trench isolation layer 21 which defines the first active region HV and the second active region LV may have a greater depth than the second trench isolation layer 22 which isolates the semiconductor devices formed on each of the first and second active regions. In the present exemplary embodiment, the first trench isolation layer 21 and the second trench isolation layer 22 are shown to be formed at the same time. Those skilled in the art can understand that, in other embodiments, the first trench isolation layer 21 and the second trench isolation layer 22 may not be formed at the same time.

In one embodiment, a first gate insulation layer of a first thickness (e.g. a thick gate insulation layer) is desired to be formed for supporting the formation of the semiconductor devices operating at the first voltage regime; and a second gate insulation layer of a second thickness (e.g. a thin gate insulation layer) is desired to be formed for supporting the formation of the semiconductor devices operating at the second voltage regime, wherein the second thickness is relatively thinner than the first thickness. In one embodiment, both a thick gate insulation layer and a thin gate insulation layer are desired to be formed for supporting the formation of the semiconductor devices operating at the first voltage regime.

For completion and ease of understanding of the present invention, a method for forming trench isolation layers 21 and 22 in accordance with an exemplary embodiment will be described firstly with reference to FIGS. 2A through 2D.

Figure 2A:
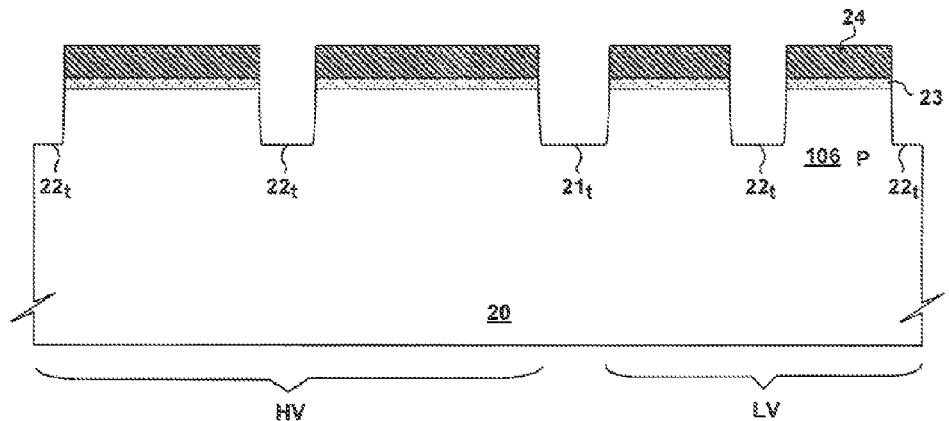

As illustrated in FIG. 2A, a pad oxide layer 23 and a first mask layer 24 are sequentially formed atop the substrate 20. Then the mask layer 24 and the pad oxide layer 23 are patterned to form a first trench 21, for defining the first active region HV and the second active region LV and a second trench $22_t$ for isolating devices on each active region by sequentially etching the first mask layer 24, the pad oxide layer 23 and the substrate 20. In one embodiment, the first mask layer 24 may be formed using conventional methods of photolithography and masking. In one embodiment, the first mask layer 24 may be patterned and etched by applying $O_2$ plasma and then wet stripping by using $H_2SO_4$, $H_2O_2$ and $NH_4OH$ solution to expose surface areas of the pad oxide layer 23 wherefrom the trenches $21_t$ and $22_t$ needing to be formed.

Figure 2B:
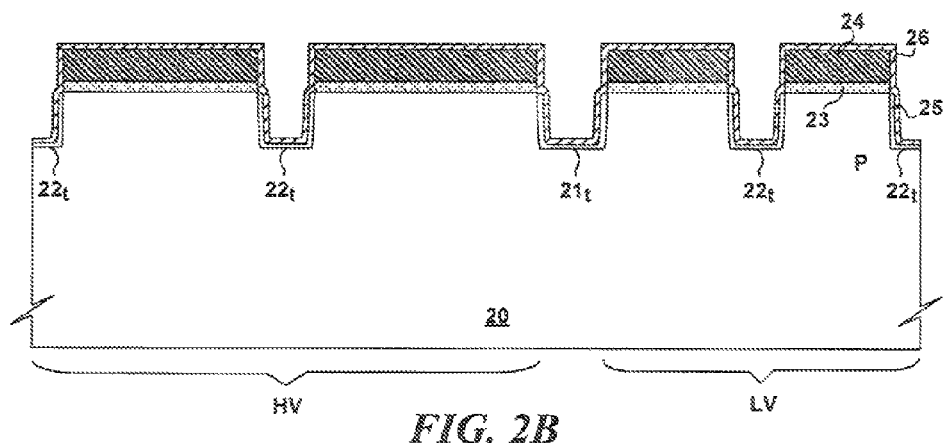

Subsequently, as illustrated in FIG. 2B, a buffer oxide layer 25 and a liner layer 26 covering the buffer oxide layer 25 are formed in the trenches $21_t$ and $22_t$, wherein the buffer oxide layer 25 may be formed by growing a thermal oxide layer on sidewalls and bottoms of the trenches $21_t$ and $22_t$, and wherein the liner layer 26 may be formed by depositing a nitride layer. The buffer oxide layer 25 may help to cure defects that have occurred during the process of etching the semiconductor substrate 20 to form the trenches $21_t$ and $22_t$, and to prevent stress and a trap center from being generated between the liner layer 26 and the substrate 20. In one embodiment, the liner layer 26 may be omitted.

Figure 2C:
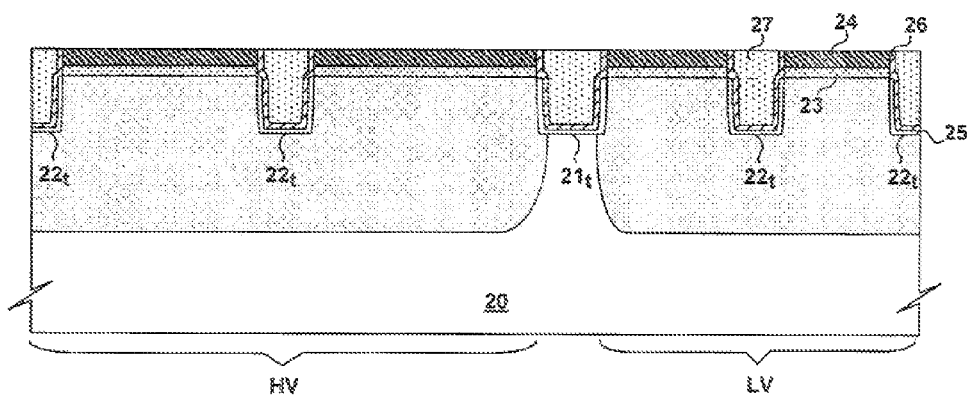

Next, as illustrated in FIG. 2C, the trenches $21_t$ and $22_t$ are filled with an insulation layer 27, and then a flattening process such as a chemical mechanical polishing (CMP) process etc. is applied to planarize a surface of the partially processed substrate 20. In one embodiment, the insulation layer 27 may comprise a field oxide layer, which may be formed of, for example, an oxide layer group such as SOG (Spin On Glass), USG (Undoped Silicate Glass), BPSG (Boron Phosphorus Silicate Glass), PSG (Phosphor Silicate Glass), PETEOS (Plasma Enhanced Tetra Ethryl Ortho Silicate) and flowable oxide material, or can be formed of a multilayer containing two or more from the oxide layer group. The oxide layer group may be formed through a CVD (chemical vapor deposition), a reflow system and a deposition using high density plasma (HDP) equipment, for example.

Figure 2D:
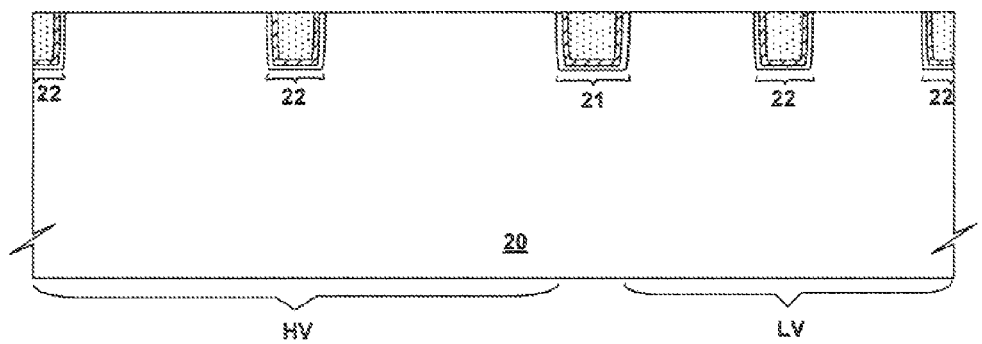

Thereafter, as illustrated in FIG. 2D, the mask layer 24 and the pad oxide layer 23 are sequentially removed, thereby completing the formation of the trench isolation layers 21 and 22 and exposing the surface of the first active region HV and the second active region LV. In one embodiment, the mask layer 24 may be removed with a wet-etching process. In one embodiment, the pad oxide layer may be removed with a wet-etching process, a dry-etching process or a combination thereof. In one embodiment, prior to removing the mask layer 24 and the pad oxide layer 23, the liner layer 26 and the insulation layer 27 formed on the mask layer 24 may be polished by a CMP process so as to planarize a surface of the substrate 20, until a predetermined thickness of the mask layer 24 remains. In one embodiment, after the formation of the STI layers 21 and 22, a second flattening process such as a chemical mechanical polishing (CMP) process etc. may be applied to planarize a surface of the partially processed substrate 20 so as to improve the quality of the subsequently formed gate insulation layers.

Now referring to FIGS. 2E through 2J, a method of forming dual gate insulation layers based on the partially processed semiconductor substrate 20 having trench isolation layers 21 and 22 will be described.

Figure 2E:
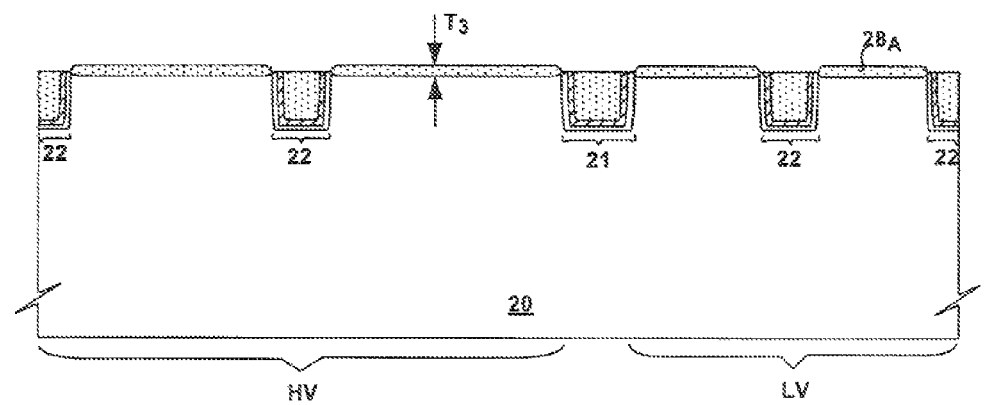

As illustrated in FIG. 2E, a first thin layer $28_A$ of a first gate insulation layer 28 (e.g. a thick gate insulation layer 28) is grown on the entire exposed surface of the first active region HV and the second active region LV by oxidizing the underlying semiconductor substrate 20. The first gate insulation layer 28 may have a first thickness $T_1$ which may depend on the requirements of the semiconductor devices operating at the first voltage regime. The first thin layer $28_A$ may have a third thickness $T_3$ that constitutes a relatively small portion of the first thickness $T_1$ of the first gate insulation layer 28. For example, in one embodiment, the first thin layer $28_A$ of the thick gate insulation layer 28 may be formed to a thickness of about e.g. 30 Å to 50 Å (i.e. the third thickness $T_3$ may be formed of about 30 Å to 50 Å). In other embodiments, the third thickness $T_3$ of the first thin layer $28_A$ may be of other values depending on the first voltage regime at which the semiconductor devices using the first gate insulation layer 28 are required to operate, with consideration of subsequent formation steps of the first gate insulation layer 28 and reducing stress near the edges of the trench isolation layers 21 and 22. In one embodiment, the first thin layer $28_A$ of the first gate insulation layer 28 may comprise a thin gate oxide layer (such as a thin silicon dioxide layer) grown with a thermal oxidation process.

Figure 2F:
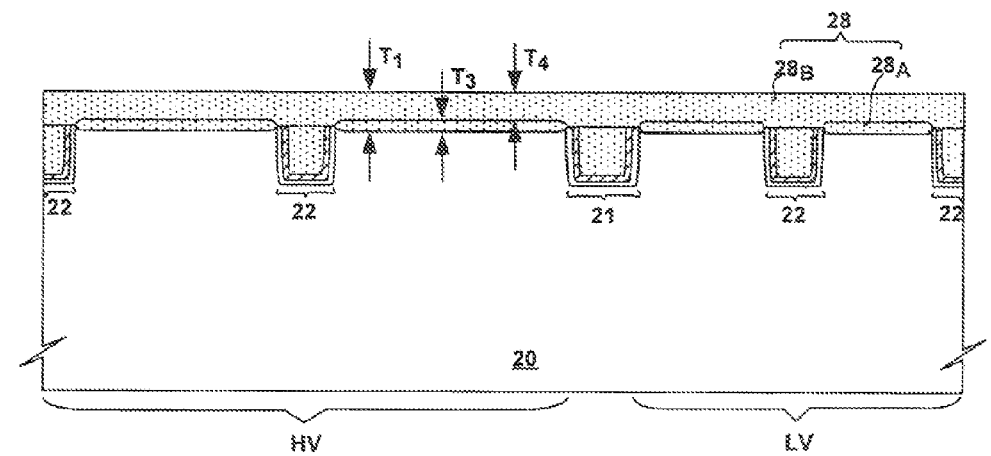

Subsequently, as illustrated in FIG. 2F, a second thicker layer $28_B$ of the first gate insulation layer 28 is deposited on the entire surface of the first thin layer $28_A$ and on the trench isolation layers 21 and 22. The second thicker layer $28_B$ may have a fourth thickness $T_4$ that constitutes a relatively large portion of the first thickness $T_1$ of the first gate insulation layer 28. For example, in one embodiment, the fourth thickness $T_4$ of the second thicker layer $28_B$ may be formed to be of about e.g. 200 Å to 600 Å, such as 250 Å to 400 Å in an exemplary embodiment. In other embodiments, the fourth thickness $T_4$ of the second thicker layer $28_B$ may be of other values depending on the first voltage regime at which the semiconductor devices using the first gate insulation layer 28 are required to operate, with consideration of insulation material loss during subsequent etching and cleaning processes to ensure that the first thickness $T_1$ can achieve a required value. In one embodiment, the second thicker layer $28_B$ of the first gate insulation layer 28 may comprise an oxide layer, which may be formed of, for example, an oxide layer group such as USG (Undoped Silicate Glass), PETEOS (Plasma Enhanced Tetra Ethryl Ortho Silicate) and flowable oxide material, or can be formed of a multilayer containing two or more from the oxide layer group. In one embodiment, the second thicker layer $28_B$ of the thick gate insulation layer 28 may be formed through a CVD (chemical vapor deposition), for example. In one embodiment, the second thicker layer $28_B$ of the thick gate insulation layer 28 may be formed through a high-temperature-oxide ("HTO") deposition process under e.g. a temperature over 850:1.

As can be seen from FIG. 2F that the first gate insulation layer 28 in accordance with an embodiment may comprise the first thin layer $28_A$ and the second thicker layer $28_B$. In one embodiment, the first thickness $T_1$ of the first gate insulation layer 28 may be formed to be of about 300 Å to 400 Å, for example. In other embodiments, the first thickness $T_1$ of the first gate insulation layer 28 (e.g. a thick gate insulation layer 28) may be of other values depending on the first voltage regime at which the semiconductor devices using the first gate insulation layer 28 formed on the first active region HV are required to operate, with consideration of insulation material loss during subsequent etching and cleaning processes.

Figure 2G:
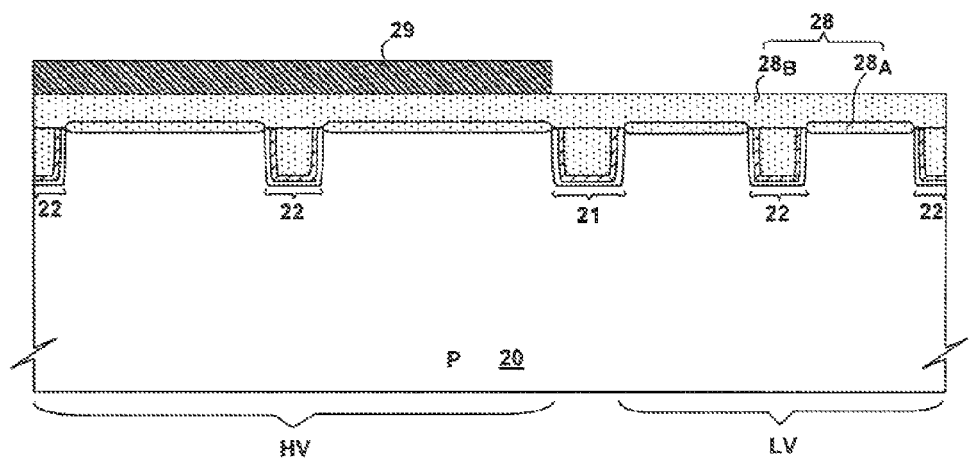

Subsequently, referring to FIG. 2G, a mask layer 29 is formed on the first gate insulation layer 28 and then patterned to expose a portion of the first gate insulation layer 28, which should be removed for exposing a surface area of the semiconductor substrate 20 whereon a second gate insulation layer (e.g. a thin gate insulation layer) is intended to be formed. The second gate insulation layer may have a, second thickness $T_2$ thinner than the first thickness $T_1$ of the first gate insulation layer 28. In one embodiment, the exposed portion of the first gate insulation layer 28 may comprise a first portion located on top of the second active region LV (as illustrated in FIG. 2G). In one embodiment, the exposed portion of the first gate insulation layer 28 may comprise a first portion located on top of the second active region LV and a second portion located on top of the first active region HV (as illustrated in FIG. 3C which will be addressed later in this description). In other embodiments, the exposed portion of the thick gate insulation layer 28 may comprise other portions. Thus, it should be understood by those having ordinary skill in the art that "a" may include plural reference and may include "a plurality of". A shape, a size and a location of the exposed portion of the first gate insulation layer 28 defined by the mask layer 29 may be modified by adjusting the pattern of the mask layer 29, which is well known to those having ordinary skill in the art. Such variations and modifications may be made without departing from the spirit and scope of the present invention. In one embodiment, the mask layer 29 may comprise a photoresist mask layer may be formed using conventional methods of photolithography and masking. In one embodiment, the mask layer 29 may be patterned and etched by applying $O_2$ plasma and then wet stripping by using $H_2SO_4$, $H_2O_2$ and $NH_4OH$ solution to expose the portion of the thick gate insulation layer 28 that needs to be removed.

Figure 2H:
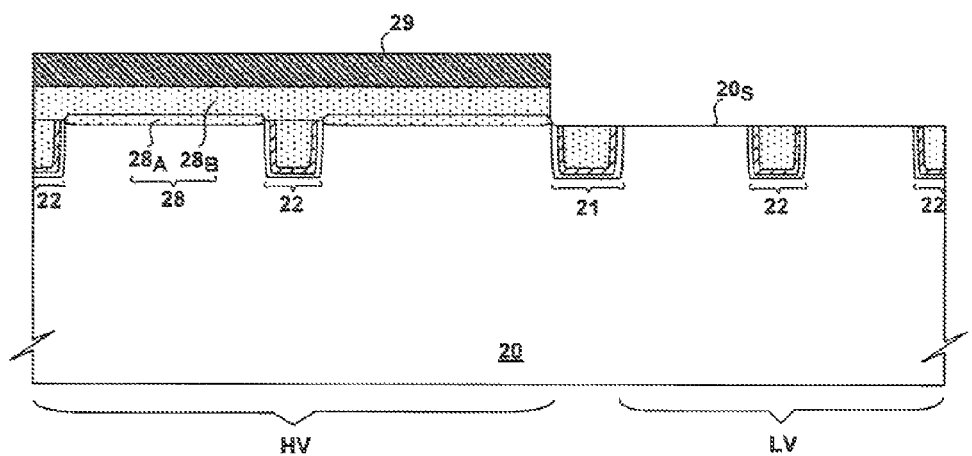

Now referring to FIG. 2H, the exposed portion of the first gate insulation layer 28 defined by the patterned mask layer 29 is removed under the masking of the patterned mask layer 29, thereby exposing a surface area $20_S$ of the semiconductor substrate 20. In the present exemplary embodiment, the exposed surface area $20_S$ is illustrated in FIG. 2H as a surface area located on top of the second active region LV. However, this is not intended to be limiting. In one embodiment, the exposed portion of first gate insulation layer 28 defined by the patterned mask layer 29 may be removed by wet etching, using diluted HF (DHF) (diluted by about 100:1) for example. In one embodiment, the exposed portion of the first gate insulation layer 28 defined by the patterned mask layer 29 may be removed by plasma dry etching.

Figure 2I:
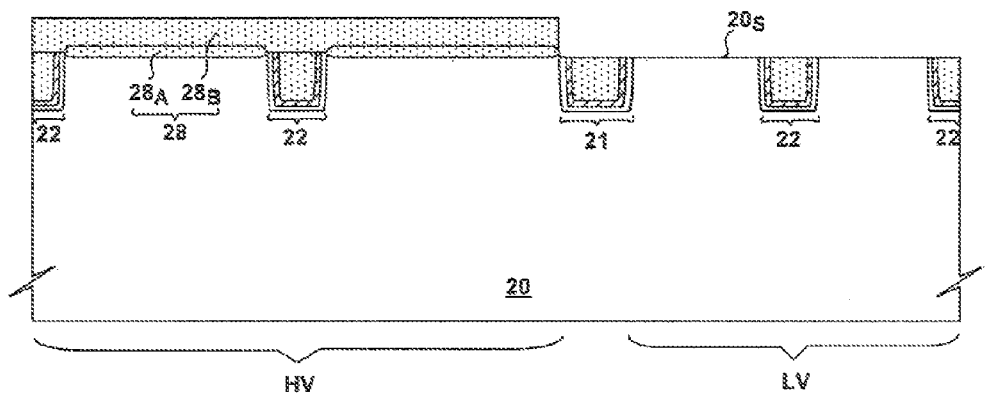

Subsequently, as illustrated in FIG. 2I, the patterned mask layer 29 is removed, thereby leaving a remained portion (which is intended to include "a plurality of remained portions") of the first gate insulation layer 28 on the semiconductor substrate 20. In one embodiment, the remained portion of the first gate insulation layer 28 may intend to be used as a thick gate dielectric for a semiconductor device such as a transistor formed on the first active region HV. However, this is not intended to be limiting. It should be understood that a size, a shape and a location of the exposed portion of the first gate insulation layer 28 are defined by the patterned mask layer 29 and can be modified according to practical requirements by modifying the pattern of the patterned mask layer 29. In one embodiment, the patterned mask layer 29 may be removed by conventional methods of ashing in an $O_2$ plasma followed by a thorough surface clean. In one embodiment, this is then followed by a step of removing contaminated top surface of the remained portion of the first gate insulation layer 28. As a consequence, the thickness of the first gate insulation layer 28 may have a reduction. In one embodiment, the removal of contaminated top surface of the remained first gate insulation layer 28 may be implemented using diluted HF (diluted between about 100:1 and 200:1) for example.

Figure 2J:
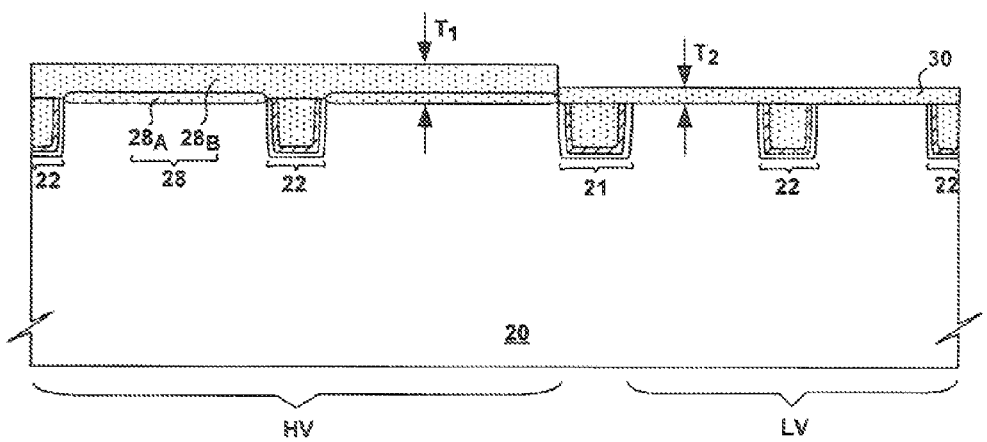

In the following, as illustrated in FIG. 2J, a second gate insulation layer 30 (e.g. a thin gate insulation layer 30) is formed over the exposed surface area $20_S$ of the semiconductor substrate 20. The second gate insulation layer 30 may have a second thickness $T_2$ thinner than the first thickness $T_1$ of the first gate insulation layer 28. In one embodiment, before the formation of the second gate insulation layer 30, a pre-thin gate insulation RCA clean may be performed at the entire surface of the structure shown in FIG. 2I. In one embodiment, the second gate insulation layer 30 may be formed by applying thermal oxidation, using a single processing chamber. In other embodiment, the second gate insulation layer 30 may also be formed with a deposited silicon dioxide layer, nitride layer, a composite oxide or nitride oxide or any other material suitable for use as a gate dielectric, or with thermal oxidation in combination with gate dielectric material deposition. In one embodiment, the second gate insulation layer 30 may be formed to a thickness of about 100 Å to 200 Å (i.e. the second thickness $T_2$ may be formed to be of about 100 Å to 200 Å), for example.

Figure 1B:
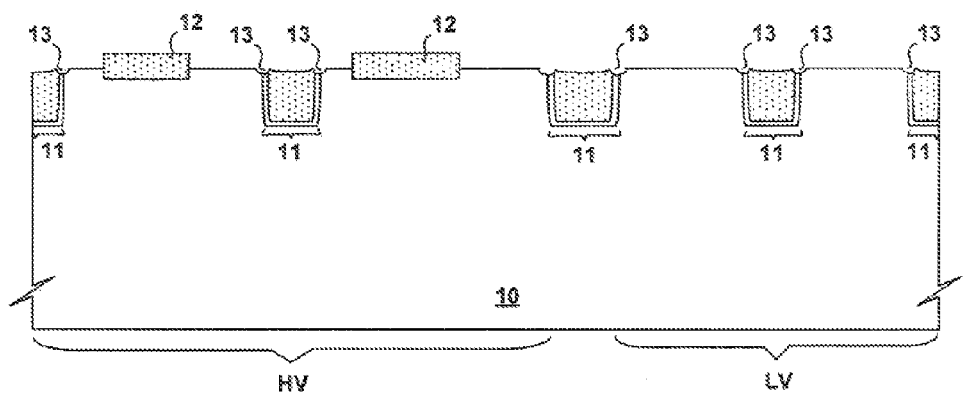
Figure 1C:
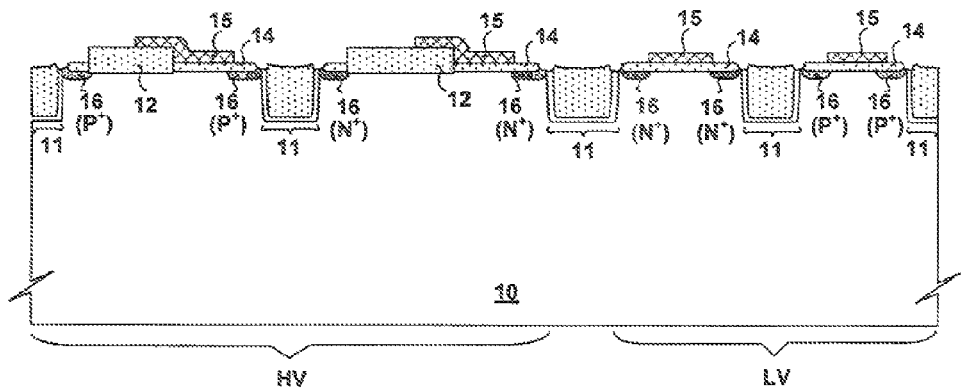

From the above descriptions, it is clear that a method for creating a first gate insulation layer of a first thickness and a second gate insulation layer of a second thickness different from the first thickness (i.e. a method for forming dual gate insulation layers) has been provided in accordance with an embodiment of the present invention. In comparison with the conventional manufacturing processes of dual gate insulation layers as illustrated in FIGS. 1A to 1C, the first gate insulation layer 28 (e.g. a thick gate insulation layer 28) according to an embodiment of the present invention is formed by firstly growing a first thin layer 28$_A$ on the semiconductor substrate 20, and then depositing a second thicker layer 28$_B$ on the first thin layer 28$_A$. In one aspect, since the first thin layer 28$_A$ has a relatively small thickness, it results in quite small semiconductor stress (e.g. silicon stress if the semiconductor substrate 20 comprises silicon) near the edges of the trench isolation layers 21 and 22 (if any of them are formed in the semiconductor substrate 20). In another aspect, forming the rest second thicker layer 28$_B$ of the first gate insulation layer 28 by directly depositing gate insulation materials on the first thin layer 28$_A$ may help to achieve good thickness control of the first gate insulation layer 28. Especially, in one embodiment high-temperature-oxide deposition is performed for forming the second thicker layer 28$_B$, which further improves the thickness control of the first gate insulation layer 28 and enhances the quality of the deposited thicker portion 28$_B$. In still another aspect, since the second thicker layer 28$_B$ of the first gate insulation layer 28 is formed by deposition, the additional second thicker layer 28$_B$ may substantially be evenly formed on the surfaces of the trench layers 21 and 22 and on the semiconductor substrate 20 (while in the conventional method of forming dual gate oxidation layers, the thick gate oxide layer formed with thermal oxidation over the STI regions 11 would be much thinner than that formed on the semiconductor substrate 10), thereby reducing the loss of insulation materials around the edges of the trench isolation layers 21 and 22 resulted from subsequent etching and cleaning processes for removing a portion of the thick gate insulation layer 28 overlying a surface area (e.g. the surface area 20$_S$ illustrated in FIG. 2H) of the semiconductor substrate 20 whereon the second gate insulation layer 30 (e.g. a thin gate insulation layer 30) should be formed. In addition, thanks to growing a thin portion 28$_A$ firstly instead of growing the whole first gate insulation layer 28 according to a conventional method, the first gate insulation layer 28 may have a quite small portion infringed down into the semiconductor substrate 20, which also helps to reduce the loss of insulation materials around and in the trench isolation layers 21 and 22 resulted from subsequent etching and cleaning processes for removing the portion of the first gate insulation layer 28 that should be removed (e.g. the exposed portion of the first gate insulation layer 28 on the second active region LV illustrated in FIG. 2G), because the etching depth into the substrate 20 is reduced for a thorough removal of the portion of the thick gate insulation layer 28 that should be removed. Therefore, according to the exemplary method of forming dual gate insulation layers in accordance with an embodiment of the present invention, pits around the trench isolation layers 21 and 22, resulted from removal of the portion of the first gate insulation layer 28 that should be removed so as to form the second gate insulation layer 30 subsequently, may be quite small and even negligible (thus are not shown in the cross-section illustrated in FIG. 2J), thereby reducing/alleviating or eliminating junction leakage around edges of the trench isolation layers 21 and 2. Thus, a good N$^+$/P-well junction or P$^+$/N-well junction may be formed around edges of the trench isolation layers 21 and 22. In yet another aspect, the first gate insulation layer 28 may have improved commensuration with the semiconductor substrate 20 by firstly growing a thin portion 28$_A$ on the semiconductor substrate 20 and then having a rest thicker portion 28$_B$ deposited, compared to directly growing or depositing the whole thick gate insulation layer 28 on the substrate 20.

Although a method of forming dual gate insulation layers on a semiconductor substrate 20 having trench isolation layers 21 and 22 is described, it should be understood by those having ordinary in the art that the method of forming dual gate insulation layers described with reference to FIGS. 2E through 2J may not necessarily be confined to proceed on a semiconductor substrate with STI isolation layers. In other embodiments, the method of forming dual gate insulation layers described with reference to FIGS. 2E through 2J may be proceeded on a semiconductor substrate having other isolation structures such as field oxide isolation layers etc. In still other embodiments, the method of forming dual gate insulation layers described with reference to FIGS. 2E through 2J may be proceeded on a semiconductor substrate without isolation structures. Those having ordinary skill in the art should understand that the exact construction of the semiconductor substrate 20 is not critical to the practice of various embodiments of the present invention and any substrate structure, including epitaxial layer and/or buried layer may be used depending on the semiconductor devices that are desired to be formed on the semiconductor substrate 20, and which may use the dual gate insulation layers manufactured with the method of forming dual gate insulation layers described with reference to FIGS. 2E through 2J in accordance with an embodiment of the present invention.

FIGS. 3A through 3H are cross-sectional views illustrating schematically a sequential process of a method for forming a semiconductor device 300 having dual gate insulation layers in accordance with an exemplary embodiment of the present invention.

Figure 3A:
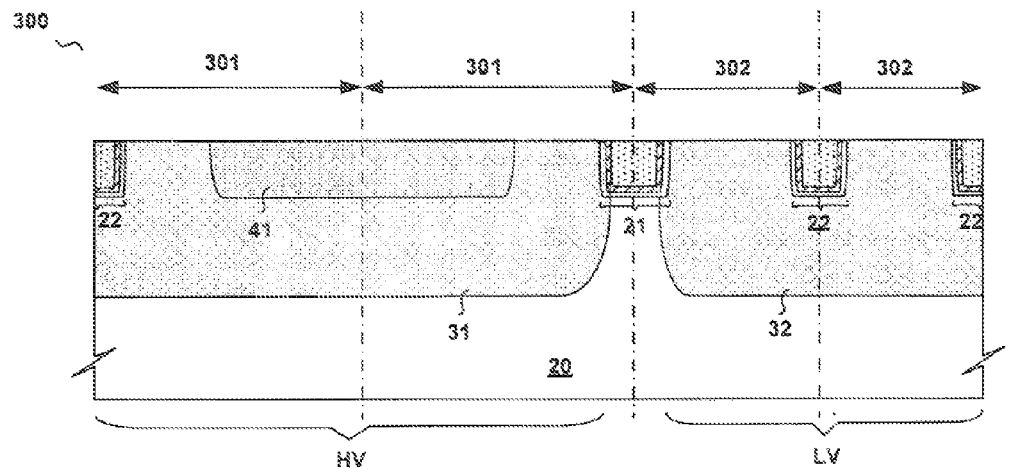
FIGS. 3A through 3H are cross-sectional views illustrating schematically a sequential process of a method for forming a semiconductor device having dual gate insulation layers in accordance with an embodiment of the present invention.

FIG. 3A illustrates schematically a cross-sectional view of the semiconductor device 300 that has been partially processed in accordance with an embodiment of the present invention. The semiconductor device 300 is formed on a semiconductor substrate 20. In one embodiment, the semiconductor substrate 20 may comprise a first active region HV of a first voltage regime (e.g. a high/medium-voltage regime) whereon semiconductor devices 301 operating at the first voltage regime are to be formed, and a second active region LV of a second voltage regime (e.g. a low-voltage regime) lower than the first voltage regime whereon semiconductor devices 302 operating at the second voltage regime are to be formed.

In one embodiment, as illustrated in FIG. 3A, the semiconductor device 300 may comprise a/a plurality of high-voltage wells 31 formed in the first active region HV, and a/a plurality of low-voltage wells 32 formed in the second active region LV. The high-voltage well 31 may either be an N-well or a P-well depending on the type of the devices 301 (e.g. N-channel devices or P-channel devices) needing to be formed and the device design method. Similarly, the low-voltage well 32 may also be an N-well or a P-well depending on the type of the devices 302 (e.g. N-channel devices or P-channel devices) needing to be formed and the device design method.

In one embodiment, the high-voltage well 31 and the low-voltage well 32 may be formed with conventional masking and implantation processes and will not be described in detail herein. In one embodiment, a high-voltage well 31 of the same type as the semiconductor substrate 20 may just be a portion of the semiconductor substrate 20 and may not need to be formed through specific well implantation process. Similarly, a low-voltage well 32 of the same type as the as the semiconductor substrate 20 may also just be a portion of the semiconductor substrate 20 and may not need to be formed through specific well implantation process.

In one embodiment, the semiconductor device 300 may further comprise a first isolation layer 21 for defining the first active region HV and the second active region LV, and a second isolation layer 22 for providing isolation between the devices 301 formed on the first active region HV and between the devices 302 formed on the second active region LV when needed. In one embodiment, the first isolation layer 21 and the second isolation layer 22 may comprise trench isolation layers such as STI layers, and may be formed with the method described previously with reference to FIGS. 2A through 2D or with any other conventional trench isolation layer formation methods. In one embodiment, the first trench isolation layer 21 which defines the first active region HV and the second active region LV may have a greater depth than the second trench isolation layer 22 which isolates the semiconductor devices 301 and 302 formed on each of the first and second active regions HV and LV.

In one embodiment, the semiconductor device 300 may further comprise a/a plurality of drift regions 41 formed in the high-voltage well 31. The drift region 41 may either be an N-drift region for forming N-channel devices or a P-drift region for forming P-channel devices. In one embodiment, the drift region 41 may be formed with conventional masking and implantation processes and will not be described in detail herein. In one embodiment, the drift region 41 may be formed before formation of the trench isolation layers 21 and 22. In one embodiment, the drift region 41 may be formed after formation of the trench isolation layers 21 and 22. In one embodiment, a drift region 41 of the same type as the high-voltage well 31 may just be a portion of the high-voltage well 31 and may not need to be formed through specific implantation process.

Figure 3B:
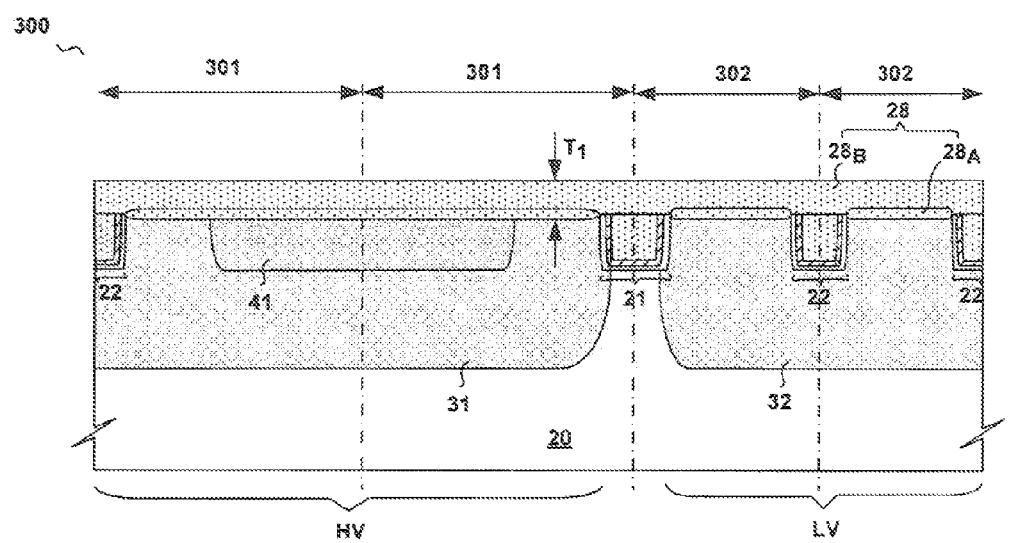
Figure 3C:
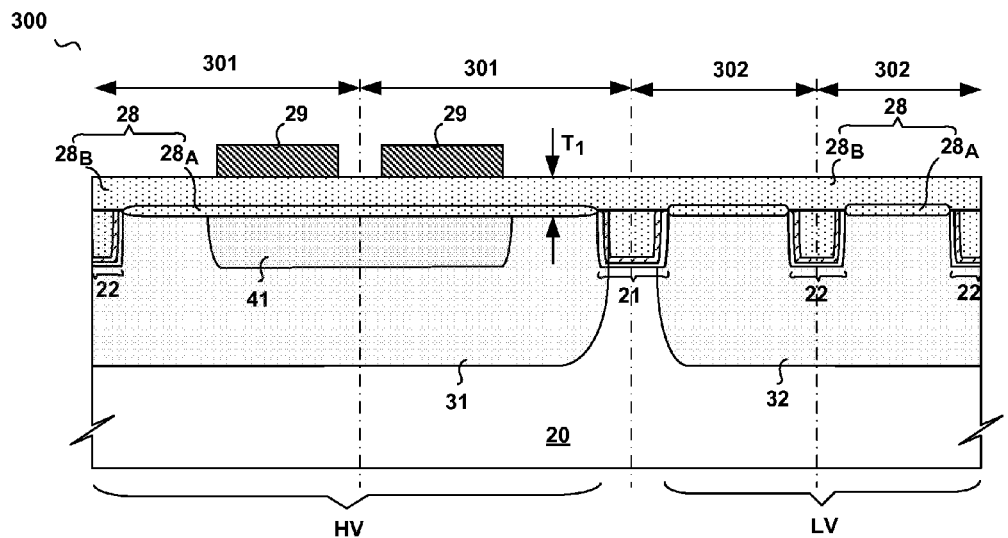

Subsequently, as illustrated in FIG. 3B, a first gate insulation layer 28 (e.g. a thick gate insulation layer 28) having a first thickness $T_1$ is formed on the entire surface of the partially processed semiconductor substrate 20 (i.e. on the entire surface of the first active region HV, the second active region LV, and the first and second isolation layers 21 and 22) wherein the first gate insulation layer 28 may Comprise a first thin layer $28_A$ grown by oxidizing the underlying semiconductor substrate 20 and a second thicker layer $28_B$ formed by depositing gate dielectric materials on the first thin layer $28_A$. In one embodiment, the first gate insulation layer 28 may be formed with the steps described previously with reference to FIGS. 2E through 2F.

Then as illustrated in FIG. 3C, a patterned mask layer 29 is applied on the first gate insulation layer 28 to expose a portion of the first gate insulation layer 28. In the present exemplary embodiment, the exposed portion of the first gate insulation layer 28 may comprise a first portion located on the second active region LV and a second portion located on the first active region HV (as illustrated in FIG. 3C, uncovered portions of the first gate insulation layer 28 by the patterned mask layer 29).

Figure 3D:
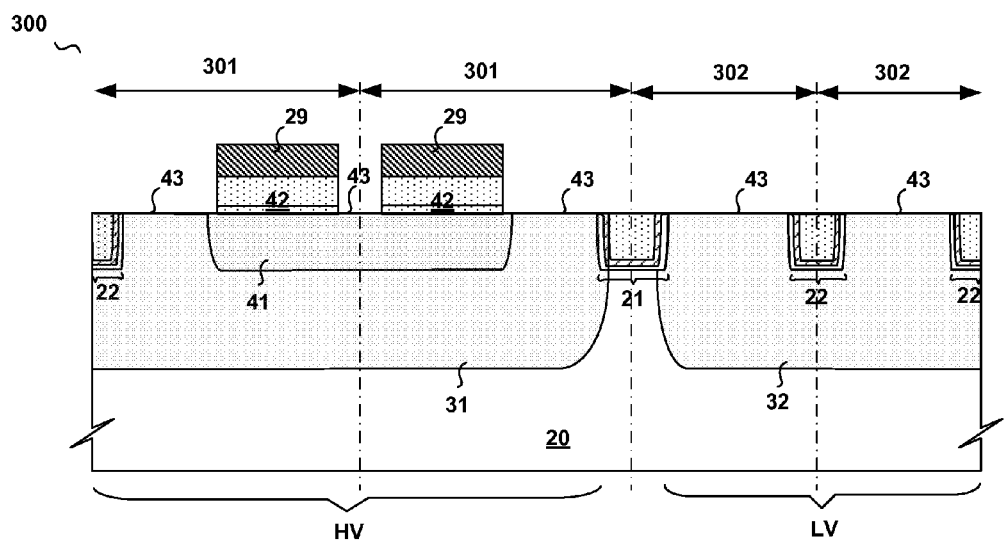

Subsequently, as illustrated in FIG. 3D, the exposed portion of the first gate insulation layer 28 defined by the patterned mask layer 29 is removed to expose a surface area 43 of the semiconductor substrate 20 underneath. In the present exemplary embodiment, the exposed surface area 43 is illustrated in FIG. 3D as to comprise a first surface area located on top of the second active region LV and a second surface area located on top of the first active region HV. The exposed surface area 43 may comprise a surface area whereon a second gate insulation layer is supposed to be formed. However, this is not intended to be limiting. Those having ordinary skill in the relevant art will understand that a size, a shape and a location of the exposed surface area 43 may be modified through modifying the pattern of the patterned mask layer 29 according to practical requirements. Such variations and modifications may be made without departing from the spirit and scope of the present invention.

Figure 3E:
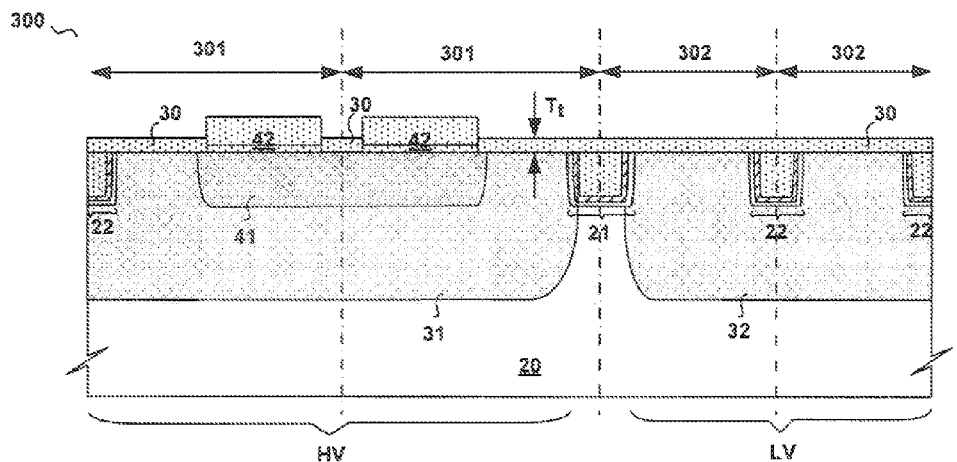

In the following, as illustrated in FIG. 3E, the patterned mask layer 29 is removed, thereby leaving a remained portion 42 (which is intended to include "a plurality of remained portions") of the first gate insulation layer 28 on the semiconductor substrate 20. In the present exemplary embodiment, the remained portion 42 of the thick gate insulation layer 28 is illustrated as located on the first active region HV and may intend to be used as a thick gate dielectric (e.g. as a thick gate dielectric atop a drift region for isolating a field plate from the drift region) for a semiconductor device 301 such as a lateral DMOS transistor formed on the first active region HV. However, this is not intended to be limiting. It should be understood that a size, a shape and a location of the remained portion 42 of the first gate insulation layer 28 are defined by the patterned mask layer 29 and can be modified according to practical requirements by modifying the pattern of the patterned mask layer 29. Such variations and modifications may be made without departing from the spirit and scope of the present invention.

In one embodiment, the first gate insulation layer 28 may be etched into the remained portion 42 with the method described previously with reference to FIGS. 2G to 2I except that the pattern of the mask layer 29 is modified.

In the following, still referring to FIG. 3E, a second gate insulation layer 30 (e.g. a thin gate insulation layer 30) having a second thickness $T_2$ is formed on the exposed surface area 43 of the semiconductor substrate 20. The second thickness $T_2$ of the second gate insulation layer 30 is thinner than the first thickness $T_1$ of the first gate insulation layer 28. In the present exemplary embodiment, the second gate insulation layer 30 is illustrated as comprising a first portion located on the first active region HV, which may intend to be used as a thin gate dielectric (e.g. as a thin gate dielectric atop a channel region for isolating a gate from the channel region) for a semiconductor device 301 such as a lateral DMOS transistor formed on the first active region HV, and a second portion located on the second active region LV, which may intend to be used as a thin gate dielectric (e.g. as a thin gate dielectric atop a channel region for isolating a gate from the channel region) for a semiconductor device 302 such as a low-voltage MOS transistor formed on the second active region LV. However, this is not intended to be limiting. It should be understood by those having ordinary skill in the art that a size, a shape and a location of the second gate insulation layer 30 could be defined by a patterned mask layer (such as the mask layer 29) and can be modified according to practical requirements by modifying the pattern of the patterned mask layer. Such variations and modifications may be made without departing from the spirit and scope of the present invention.

In one embodiment, the second gate insulation layer 30 may be formed with the steps described previously with reference to FIGS. 2G through 2J except that the pattern of the mask layer 29 is modified.

Figure 3F:
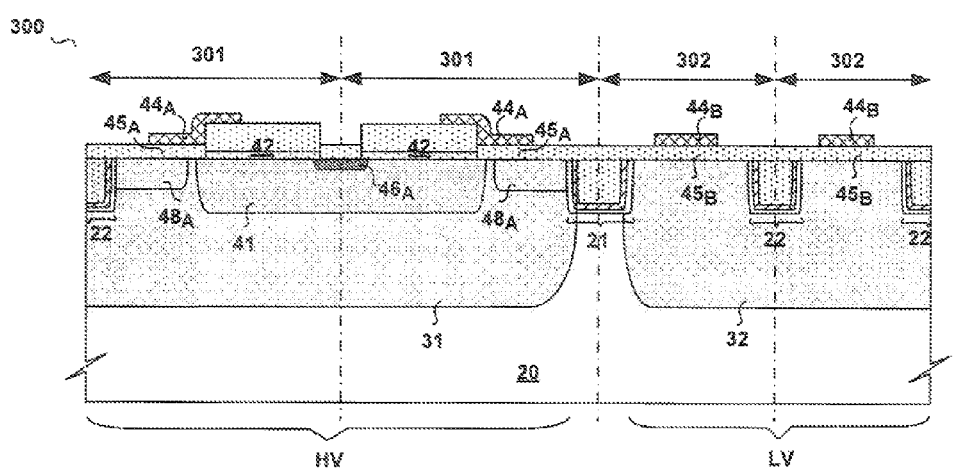

In the following, as illustrated in FIG. 3F, a gate layer is formed on top of the first active region HV and the second active region LV. Then the gate layer is masked and etched to form a first gate $44_A$ (which is intended to include "a plurality of first gates $44_A$) on top of the first active region HV, and a second gate $44_B$ (which is intended to include "a plurality of second gates $44_B$) on top of the second active region LV. In one embodiment, the first gate $44_A$ is used for a first semiconductor device 301 operating at the first voltage regime (or the plurality of first gates $44_A$ are respectively used for a first plurality of semiconductor devices 301 operating at the first voltage regime), and the second gate $44_B$ is used for a second semiconductor device 302 operating at the second voltage regime (or the plurality of second gates 44B are respectively used for a second plurality of semiconductor devices 302 operating at the second voltage regime). In one embodiment, the first gate $44_A$ (each first gate $44_A$) may overlay at least a portion of the remained portion 42 of the first gate insulation layer 28, and the second gate $44_B$ (each second gate $44_B$) may overlay at least a portion of the second gate insulation layer 30.

In the present exemplary embodiment, the first semiconductor device 301 (each of the first plurality of semiconductor devices 301) operating at the first voltage regime may comprise a DMOS transistor. In this case, the first gate $44_A$ (each first gate $44_A$) may comprise (as shown in FIG. 3F) a first portion overlaying a portion of the second gate insulation layer 30 and a second portion overlaying a portion of the remained portion 42 of the first gate insulation layer 28, wherein the remained portion 42 constitutes a thick gate dielectric used for the first semiconductor device 301 (such as a DMOS transistor) operating at the first voltage regime so as to support a high drain-to-gate voltage (e.g. the remained portion 42 of the first gate insulation layer 28 may function as a thick gate dielectric atop a drift region of the DMOS transistor 301), and wherein the portion of the second gate insulation layer 30 underlying the first portion of the gate $44_A$ constitutes a thin gate dielectric $45_A$ used for the first semiconductor device 301 so as to control a channel region of the first semiconductor device 301. In the present exemplary embodiment, the second semiconductor device 302 (each of the first plurality of semiconductor devices 302) operating at the second voltage regime may comprise a low voltage MOS transistor. The second gate $44_B$ (each second gate $44_B$) may overlay a portion of the second gate insulation layer 30 on the second active region LV, wherein the portion of the second gate insulation layer 30 underlying the second gate $44_B$ constitutes a thin gate dielectric $45_B$ used for the second semiconductor device 302 so as to control a channel region of the second semiconductor device 302. Methods and processes for forming the first gate $44_A$ (the plurality of first gates 444 and the second gate $44_B$ (the plurality of second gates $44_B$) are well known to those skilled in the art and will not be described in detail herein to avoid obscuring aspects of the present invention.

Figure 3G:
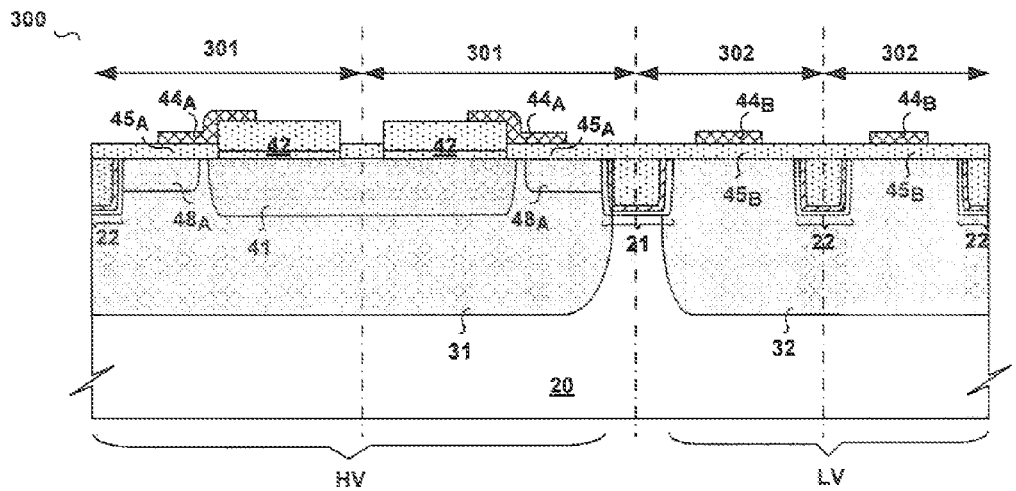

Next, as illustrated in FIG. 3G, source and drain regions $46_A$ for the first semiconductor device 301 (the first plurality of semiconductor devices 301) operating at the first voltage regime are formed in the first active region HV, and source and drain regions $46_B$ for the second semiconductor device 302 (the second plurality of semiconductor devices 302) operating at the second voltage regime are also formed in the second active region LV. In the present exemplary embodiment, a body contact region $47_A$ and a body region $48_A$ of the first semiconductor device 301 (each of the first plurality of semiconductor devices 301) are also formed in the first active region HV, wherein a body contact region $47_A$ is adjacent and connected to a source region $46_A$, and a body region $48_A$ is surrounding a source region $46_A$. In the present exemplary embodiment, a body contact region $47_B$ of the second semiconductor device 302 (each of the first plurality of semiconductor devices 302) may also be formed in the second active region LV, wherein a body contact region $47_B$ is adjacent and connected to a source region $46_B$. It is well known to those having ordinary skill in the art that, for an N-channel device, a source/drain region $46_A$ and/or $46_B$ may comprise a highly-doped $N^+$ region, a body contact region $47_A$ and/or $47_B$ may comprise a highly-doped $P^+$ body contact region and a body region $48_A$ may comprise a P-body region, while for a P-channel device, a source/drain region $46_A$ and/or $46_B$ may comprise a highly-doped $P^+$ region, a body contact region $47_A$ and/or $47_B$ may comprise a highly-doped $N^4$ body contact region and a body region $48_A$ may comprise an N-body region. Methods for forming the source/drain regions $46_A$ and $46_B$, body contact regions $47_A$ and $47_B$ and body regions $48_A$ are well known to those skilled in the art and are not described in detail herein to avoid obscuring aspects of the present invention.

For instance, in one embodiment, the body regions $48_A$ may be formed after forming the gates $44_A$ and $44_B$ by, for example, implanting ions (e.g. N-type dopants for P-channel devices or P-type dopants for N-channel devices) into the high-voltage well 31 followed by a thermal driving process. In other embodiment, the body regions $48_A$ may be formed prior to forming the gates $44_A$ and $44_B$, as exemplarily illustrated in FIG. 3F. In one embodiment, the source/drain regions $46_A$ and $46_B$, and the body contact regions $47_A$ and $47_B$ may be formed at the same time after forming the gates $44_A$ and $44_B$, and the body regions $48_A$ through, for example, implantation followed by a driving in process. However, in other embodiment, the source/drain regions $46_A$ and $46_B$ (e.g. illustrated as of $N^+$ type in FIG. 3G), and the body contact regions $47_A$ and $47_B$ (e.g. illustrated as of $P^+$ type in FIG. 3G) may not be formed at the same time, alternately, $N^+$ type regions which may be used for N-channel device source/drain region and P-channel device body contact region may be formed before $P^+$ type regions which may be used for P-channel device source/drain region and N-channel device body contact region (e.g. in the present exemplary embodiment shown in FIG. 3G, the source/drain regions $46_A$ and $46_B$ may be driven-in before the body contact regions $47_A$ and $47_B$ are implanted, to avoid diffusing the body contact regions $47_A$ and $47_5$ while diffusing the source/drain regions $46_A$ and $46_B$). Although the processes for forming the body regions $48_A$, and the body contact regions $47_A$ and $47_B$ may generally be separated, in other embodiments a retrograde body region $48_A$ may be employed instead of forming a body region $48_A$ and a body contact region $47_A$ separately.

It should be noted by those having ordinary skill in the art that during the formation of the source/drain regions $46_A$ and $46_B$, body contact regions $47_A$ and $47_B$ and body regions $48_A$ etc., $N^+$/P-well junction or $P^+$/N-well junction formed near the edges of the trench isolation layers 21 and 22 can be maintained in a good condition since there are only quite small negligible pits appeared near the trench isolation (21 and 22) edges during forming the thick gate insulation layer 28 and the thin gate insulation layer 30 with the method of forming dual gate insulation layers provided in accordance with an exemplary embodiment of the present invention.

Figure 3H:
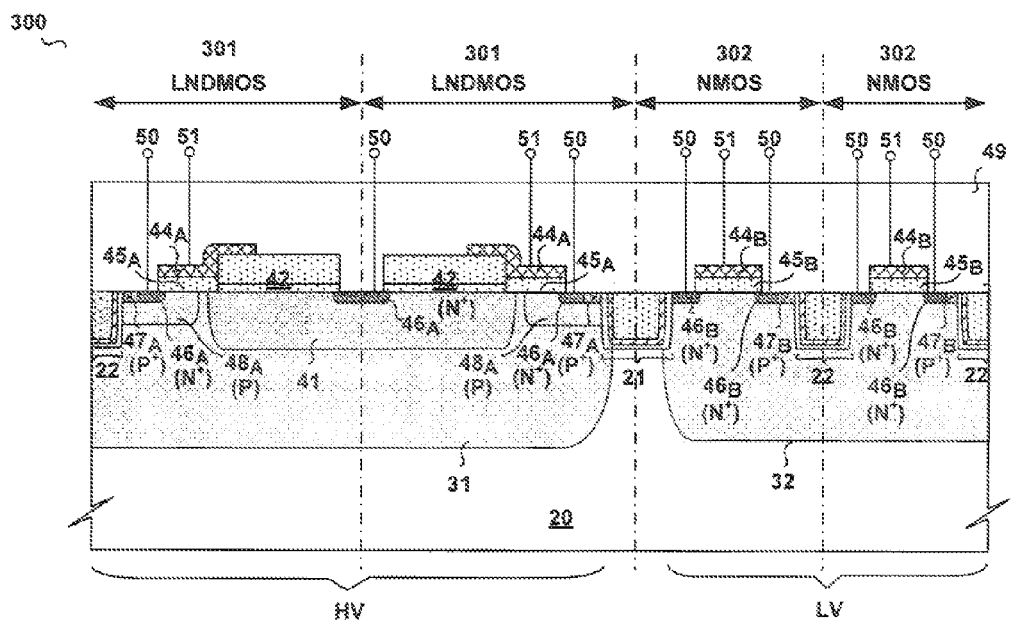

Subsequently, as illustrated in FIG. 3H, an interlayer dielectric layer 49 coating the entire surface of the semiconductor device 300 is formed. In the following source/drain electrodes 50 are formed and gate electrodes 51 are also formed, wherein the source/drain electrodes 50 are respectively coupled to the source/drain regions 46, and wherein the gate electrodes 51 are respectively coupled to the gates $44_A$ and $44_B$. Methods for forming the source/drain electrodes 50 and gate electrodes 50 are well known to those skilled in the art and are not described in detail herein to avoid obscuring aspects of the present invention.

In the present exemplary embodiment, the semiconductor device 300 formed according to the method described with reference to FIGS. 3A through 3H is illustrated as to comprise lateral N-channel double diffused metal-oxide semiconductor transistors ("LNDMOS") 301 on the first active region HV, and N-channel metal-oxide semiconductor transistors ("NMOS") 302 on the second active region LV. However, this is not intended to be limiting.

According to the exemplary method of forming a semiconductor device 300 having dual gate insulation layers illustrated in FIGS. 3A through 3H, each DMOS transistor 301 formed on the first active region HV of the semiconductor device 300 may comprise a thick gate dielectric 42, a thin gate dielectric $45_A$, and a gate $44_A$ comprising a first portion atop the thin gate dielectric $45_A$ and a second portion overlaying a portion of the thick gate dielectric 42 to support a relatively high drain-to-gate voltage. Each MOS transistor 302 formed on the second active region LV of the semiconductor device 300 may comprise a gate $44_B$ and a thin gate dielectric $45_B$ underlying the gate $44_B$ to support a relatively low drain-to-gate voltage. The thick gate dielectric 42, the thin gate dielectric $45_A$ and the thin gate dielectric $45_B$ may be formed with the method of forming dual gate insulation layers described with reference to FIGS. 2E through 2J, with quite a few modifications, such as mask pattern modification etc., which are well known to those having ordinary skill in the art. In this way, the thick gate dielectric 42 may comprise a first thin layer grown by oxidizing the underlying semiconductor substrate, and a second thicker layer directly deposited on the first thin layer, by high-temperature-oxide deposition for example.

As is well known to one having ordinary skill in the art, a lateral DMOS transistor such as a lateral P-channel double diffused metal-oxide semiconductor transistor ("LPDMOS") or a lateral N-channel double diffused metal-oxide semiconductor transistor ("LNDMOS") is an important type of high-voltage transistors that are widely used in integrated circuits. A LPDMOS/LNDMOS having a thick gate dielectric on a drift region and a field plate atop the thick gate dielectric (such as the LNDMOS illustrated in FIG. 3H, wherein a portion of the gate $44_A$ extending on the thick gate insulation layer 42 functions as a field plate) may be able to support a high breakdown voltage while maintain a low on-resistance and area product (RON*A), which is generally referred to as a specific on-resistance. However, with a conventional method for forming dual gate insulation layers (e.g. the method described with reference to FIGS. 1A through 1C), it is tough to integrate such a LPDMOS/LNDMOS with other low-voltage devices on an integrated circuit using trench isolation structures, because junction leakage around edges of the trench isolation structures may be severe. One way to resolve this problem is to replace such a LPDMOS/LNDMOS having a thick gate dielectric layer on a drift region and a field plate atop the thick field insulation layer (referred to as a "TGO DMOS" in the following) by a LPDMOS/LNDMOS having a shallow trench isolation layer on a drift region and a field plate atop the shallow trench isolation layer (referred to as a "STI DMOS" in the following). However, a STI DMOS usually has a higher specific on-resistance (RON*A) than a TGO DMOS, which is undesirable or even can not meet the requirements for fabricating high integration and low power dissipation integrated circuits.

Methods and processes of forming dual gate insulation layers and semiconductor device having dual gate insulation layers described in various embodiments of the present invention allow the integration and formation of a TGO DMOS together with other low-voltage devices on an integrated circuit using trench isolation structures, and provide good control of junction leakage around edges of the trench isolation structures.

The advantages of the various embodiments of the present invention are not confined to those described above. These and other advantages of the various embodiments of the present invention will become more apparent upon reading the whole detailed descriptions and studying the various figures of the drawings.

Methods and processes of forming dual gate insulation layers and semiconductor devices having dual gate insulation layers described in various embodiments of the present invention are illustrative and not intended to be limiting. Well known manufacturing steps, processes, materials and dopants etc. are not described in detail to avoid obscuring aspects of the technology. Those skilled in the art should understand that the steps described in the embodiments shown may be implemented in different orders and are not limited to the embodiments described.

Although methods and processes of forming dual gate insulation layers are illustrated and explained based on a semiconductor substrate with trench isolation structures, and methods and processes of forming a semiconductor device having dual gate insulation layers are illustrated and explained based on forming a semiconductor device 300 comprising LNDMOS and NMOS on a semiconductor substrate with trench isolation structures according to various embodiments of the present invention, but this is not intended to be limiting, and persons of ordinary skill in the art will understand that the methods, processes, structures and principles taught herein may apply to any other fabrication processes for forming semiconductor devices having dual gate insulation layers. For example, the method and processes disclosed herein for forming dual gate insulation layers may not be confined to be just used for forming semiconductor devices with TGO DMOS and low-voltage MOS transistors integrated. Semiconductor devices comprising complementary metal-oxide semiconductor ("CMOS") transistors having dual gate insulation layers may also be fabricated with the method and processes disclosed herein for forming dual gate insulation layers without departing from the spirit and scope of the present invention.

From the foregoing, it will be appreciated that specific embodiments of the technology have been described herein for purposes of illustration, but that various modifications may be made without deviating from the technology. Many of the elements of one embodiment may be combined with other embodiments in addition to or in lieu of the elements of the other embodiments. Accordingly, the technology is not limited except as by the appended claims.

I claim:

1. A method for forming dual gate insulation layers, comprising:
   providing a semiconductor substrate;
   forming a first thin layer of a first gate insulation layer on the semiconductor substrate by oxidizing the underlying semiconductor substrate;
   depositing a second thicker layer of the first gate insulation layer on the first thin layer, wherein the first gate insulation layer has a first thickness;
   removing a portion of the first gate insulation layer, thereby exposing a surface area of the semiconductor substrate; and
   forming a second gate insulation layer on the exposed surface area of the semiconductor substrate, wherein the second gate insulation layer has a second thickness thinner than the first thickness.

2. The method of claim 1, wherein forming the first thin layer of the first gate insulation layer by oxidizing the underlying semiconductor substrate comprises a thermal oxidation process.

3. The method of claim 1, wherein depositing the second thicker layer of the first gate insulation layer on the first thin layer comprises a high-temperature-oxide deposition process.

4. The method of claim 1, wherein the first thin layer and the second thicker layer of the first gate insulation layer comprise silicon dioxide.

5. The method of claim 1, wherein the first thin layer of the first gate insulation layer is formed to a third thickness, and wherein the second thicker layer of the first gate insulation layer is formed to a fourth thickness, and wherein the third thickness is thinner than the fourth thickness.

6. The method of claim 1, wherein providing the semiconductor substrate comprises:
 providing a semiconductor substrate having a first active region of a first voltage regime and a second active region of a second voltage regime different from the first voltage regime, wherein the first active region is designated for forming semiconductor devices operating at the first voltage regime, and wherein the second active region is designated for forming semiconductor devices operating at the second voltage regime.

7. The method of claim 6, wherein the removed portion of the first gate insulation layer comprises a first portion located on top of the second active region.

8. The method of claim 6, wherein the removed portion of the first gate insulation layer comprises a first portion located on top of the second active region and a second portion located on top of the first active region.

9. The method of claim 6 further comprising:
 forming a first isolation layer and a second isolation layer in the semiconductor substrate before forming the first thin layer of the thick gate insulation layer, wherein the first isolation layer is formed for defining the first active region and the second active region, and wherein the second isolation layer is formed for isolating the semiconductor devices that will be formed on each of the first active region and the second active region.

10. The method of claim 9, wherein the first isolation layer and the second isolation layer comprise trench isolation layers.

11. The method of claim 9, wherein forming the first isolation layer and the second isolation layer comprises:
 sequentially forming a pad oxide layer and a mask layer atop the semiconductor substrate;
 patterning the mask layer and the pad oxide layer to form a first trench for defining the first active region and the second active region, and a second trench for isolating the semiconductor devices that will be formed on each of the first and second active regions by sequentially etching the mask layer, the pad oxide layer and the semiconductor substrate;
 forming a liner layer on sidewalls and bottoms of the first and second trenches;
 filling the first and second trenches with an insulation layer; and
 removing the mask layer and the pad oxide layer.

12. A method of forming a semiconductor device having dual gate insulation layers, comprising:
 providing a semiconductor substrate having a first active region of a first voltage regime and a second active region of a second voltage regime different from the first voltage regime;
 forming a first thin layer of a first gate insulation layer on the semiconductor substrate by oxidizing the underlying semiconductor substrate;
 depositing a second thicker layer of the first gate insulation layer on the first thin layer, wherein the first gate insulation layer has a first thickness;
 removing a portion of the first gate insulation layer, thereby leaving a remained portion of the first gate insulation layer and exposing a surface area of the semiconductor substrate;
 forming a second gate insulation layer on the exposed surface area of the semiconductor substrate, wherein the second gate insulation layer has a second thickness thinner than the first thickness;
 forming a first gate on top of the first active region and a second gate on top of the second active region, wherein the first gate overlies at least a portion of the remained portion of the first gate insulation layer, and wherein the second gate overlies at least a portion of the second gate insulation layer, and wherein the first gate is used for a first semiconductor device operating at the first voltage regime, and wherein the second gate is used for a second semiconductor device operating at the second voltage regime; and
 forming source and drain active regions in the semiconductor substrate for the first semiconductor device and the second semiconductor device.

13. The method of claim 12, wherein
 the exposed surface area of the semiconductor substrate comprises a first surface area located on top of the second active region and a second surface area located on top of the first active region; and wherein
 the remained portion of the first gate insulation layer is located on top of the first active region and constitutes a thick gate dielectric used for the first semiconductor device operating at the first voltage regime; and wherein
 the first gate comprises a first portion and a second portion, wherein the first portion is overlying a portion of the second gate insulation layer located on top of the first active region, and wherein the second portion is overlying a portion of the remained portion of the first gate insulation layer.

14. The method of claim 13, wherein the first semiconductor device operating at the first voltage regime comprises a lateral DMOS transistor.

15. The method of claim 12, wherein forming the first thin layer of the first gate insulation layer by oxidizing the underlying semiconductor substrate comprises a thermal oxidation process.

16. The method of claim 12, wherein depositing the second thicker layer of the first gate insulation layer on the first thin layer comprises a high-temperature-oxide deposition process.

17. The method of claim 12 further comprising:
 forming a first isolation layer and a second isolation layer in the semiconductor substrate before forming the first thin layer of the first gate insulation layer, wherein the first isolation layer is formed for defining the first active region and the second active region, and wherein the second isolation layer is formed for isolating the first and second semiconductor devices that will be formed on each of the first active region and the second active region.

18. A method of forming a lateral DMOS, comprising:
 providing a semiconductor substrate;
 forming a first thin layer of a thick gate insulation layer on the semiconductor substrate by oxidizing the underlying semiconductor substrate;
 depositing a second thicker layer of the thick gate insulation layer on the first thin layer;

removing a portion of the thick gate insulation layer, thereby leaving a remained portion of the thick gate insulation layer and exposing a surface area of the semiconductor substrate, wherein the remained portion of the thick gate insulation layer constitutes a thick gate dielectric of the lateral DMOS;

forming a thin gate insulation layer on the exposed surface area of the semiconductor substrate;

forming a gate of the lateral DMOS, wherein the gate comprises a first portion overlying a portion of the thin gate insulation layer and a second portion overlying a portion of the thick gate dielectric; and forming source and drain active regions in the semiconductor substrate for the lateral DMOS.

19. The method of claim 18, wherein forming the first thin layer of the thick gate insulation layer by oxidizing the underlying semiconductor substrate comprises a thermal oxidation process.

20. The method of claim 18, wherein depositing the second thicker layer of the thick gate insulation layer on the first thin layer comprises a high-temperature-oxide deposition process.

\* \* \* \* \*